United States Patent
Yogeswaren

(10) Patent No.: US 10,635,759 B2
(45) Date of Patent: *Apr. 28, 2020

(54) METHODS AND SYSTEMS FOR MULTICOMPONENT TIME-LAPSE SEISMIC MEASUREMENT TO CALCULATE TIME STRAINS AND A SYSTEM FOR VERIFYING AND CALIBRATING A GEOMECHANICAL RESERVOIR SIMULATOR RESPONSE

(71) Applicant: Geoscale, Inc., Houston, TX (US)

(72) Inventor: Elan Yogeswaren, Houston, TX (US)

(73) Assignee: GEOSCAPE ANALYTICS, INC., Houston, TX (US)

( * ) Notice: Subject to any disclaimer, the term of this patent is extended or adjusted under 35 U.S.C. 154(b) by 1054 days.

This patent is subject to a terminal disclaimer.

(21) Appl. No.: 14/795,725

(22) Filed: Jul. 9, 2015

(65) Prior Publication Data

US 2015/0324503 A1  Nov. 12, 2015

Related U.S. Application Data

(63) Continuation of application No. 12/793,409, filed on Jun. 3, 2010, now Pat. No. 9,110,190.

(51) Int. Cl.
*G01V 1/30* (2006.01)
*G06F 17/16* (2006.01)
(Continued)

(52) U.S. Cl.
CPC ............ *G06F 17/5009* (2013.01); *G01V 1/28* (2013.01); *G01V 1/308* (2013.01); *G06F 17/16* (2013.01); *G01V 2210/67* (2013.01)

(58) Field of Classification Search
CPC ...... G01V 1/28; G01V 1/308; G01V 2210/67; G06F 17/5009; G06F 17/16
(Continued)

(56) References Cited

U.S. PATENT DOCUMENTS

| 7,243,064 B2 | 7/2007 | Paris |
| 7,577,061 B2 | 8/2009 | Williamson et al. |
| 9,110,190 B2 * | 8/2015 | Yogeswaren ............ G01V 1/28 |

OTHER PUBLICATIONS

Boore, D. M., Finite Difference Methods for Seismic Wave Propagation in Heterogeneous Materials, 1972, pp. 1-37, vol. 11, Academic Press, New York.

(Continued)

*Primary Examiner* — Daniel L Murphy
(74) *Attorney, Agent, or Firm* — Norton Rose Fulbright US LLP

(57) ABSTRACT

A system, method, and computer program configured to provide an electronic method for seismic time-lapse characterization of an underground formation are provided. The method includes decomposing, with microprocessor executing a predefined set of instructions stored in a memory, baseline and monitor seismic survey data of a formation into a four dimensional Clifford Algebraic form; extracting, via the microprocessor, time delays from a matrix of decomposed sensor measurement vectors generated based on the four dimensional Clifford Algebra form; and determining, via the processor, time strains for the underground formation from differences in the extracted time delays from the matrix before displaying the determined time strains for the underground formation to a user via a monitor or a hard copy printed document. A procedure is also provided to calibrate and refine the static and dynamic models of an underground formation using the results from the seismic time-lapse characterization.

13 Claims, 5 Drawing Sheets

(51) Int. Cl.
  *G06F 17/50* (2006.01)
  *G01V 1/28* (2006.01)
(58) Field of Classification Search
  USPC .................................. 367/38; 702/16; 703/2
  See application file for complete search history.

(56) References Cited

OTHER PUBLICATIONS

Cerveny, V., Seismic Ray Theory, 2001, Cambridge University Press, New York.

Datta-Gupta, A. et al., Streamline Simulation: Theory and Practice, 2007, pp. 1-13, vol. 11, Society of Petroleum Engineers, Richardson, Texas.

Deutsch, C. V. Geostatistical Reservoir Modeling, 2002, Oxford University Press, New York.

Ewing, T. E. et al., Late Vretaceous Volcanism in South and Central Texas—Strategic, Structural, and Seismic Models, 1982, pp. 137-145, vol. 32, Gulf Coast Association of Geological Societies.

Landro, M. et al., Quantitative estimation of compaction and velocity changes using 4D impedance and traveltime changes, Jul.-Aug. 2004, pp. 949-957, vol. 69, No. 4, Geophysics.

Marfurt, K. J., Accuracy of finite-difference and finite-element modeling of the scalar and wave equations, May 1984, pp. 533-549, vol. 49, No. 5, Geophysics.

Nair, R. et al., A finite element porothermoelastic model for dual-porosity media, 2004, pp. 875-898, vol. 28, International Journal for Numerical and Analytical Methods in Geomechanics.

Orfandis, S. J., Optimum Signal Processing; An Introduction, 1988, pp. 341-344 and 369-372, Macmillan Publishing Company, New York.

Smith, W. D., The Application of Finite Element Analysis to Body Wave Propagation Problems, 1975, pp. 747-768, vol. 42, Geophys. J. Roy Ast. Soc.

Wen et al., Production Data Integration in Sand/Shale Reservoirs Using Sequential Self-Calibration and GeoMorphing: A Comparison; SPE 78139; first presented at the 2000 SPE Annual Technical Conference and Exhibition, Dallas 2000; 2002; pp. 255-265.

Zienkiewicz, O. C. et al., The Finite Element Method: For Solid and Structural Mechanics, 2005, pp. 24-29 and 45-61, Sixth edition, Elsevier Butterworth-Heinemann, Burlington, MA.

Zienkiewicz, O. C. et al., The Finite Element Method: Its Basis and Fundamentals, 2005, pp. 645-649, Sixth edition, Elsevier Butterworh-Heinemann, Burlington, MA.

\* cited by examiner

METHODS AND SYSTEMS FOR MULTICOMPONENT TIME-LAPSE SEISMIC MEASUREMENT TO CALCULATE TIME STRAINS AND A SYSTEM FOR VERIFYING AND CALIBRATING A GEOMECHANICAL RESERVOIR SIMULATOR RESPONSE

CROSS REFERENCE TO RELATED APPLICATIONS

This application is a continuation of U.S. patent application Ser. No. 12/793,409, filed Jun. 3, 2010 and entitled "METHODS AND SYSTEMS FOR MULTICOMPONENT TIME-LAPSE SEISMIC MEASUREMENT TO CALCULATE TIME STRAINS AND A SYSTEM FOR VERIFYING AND CALIBRATING A GEOMECHANICAL RESERVOIR SIMULATOR RESPONSE," which claims the benefit of the filing date of U.S. Provisional Patent Application Ser. No. 61/183,605, filed on Jun. 3, 2009 and entitled "METHODS AND SYSTEMS FOR MULTICOMPONENT TIME-LAPSE SEISMIC MEASUREMENT TO CALCULATE TIME STRAINS AND A SYSTEM FOR VERIFYING AND CALIBRATING A GEOMECHANICAL RESERVOIR SIMULATOR RESPONSE," the disclosures of which are incorporated by reference herein in their entirety.

BACKGROUND OF THE DISCLOSURE

Field of the Disclosure

Embodiments of the present disclosure generally relate to the fields of geology, geophysics, and geomechanics.

Description of the Related Art

Reservoir surveillance, using a series of time-lapse seismic snapshots and comparing these to an initial baseline snapshot, can be used to track subterranean rock deformation and fluid flow, leading to better characterization and management of hydrocarbon producing fields. Production and/or injection induced changes in formation pressure, formation stress state, fluid phase saturation, formation temperature, and other relevant parameters are generally known to cause variations in elastic and acoustic impedances and vertical dimensions of reservoir rocks or other formations. These variations in attributes can be monitored by geophysical measurements including 3D Surface Seismic, Vertical Seismic Profile, and Cross Borehole Seismic surveys taken at acceptable intervals while the field is in operation. Changes in seismic measurement attributes including amplitude, phase, impedance and travel-time are qualitatively or quantitatively linked to changes in subterranean parameters such as pressure, stress, saturation, strain, and temperature, and surface parameters such as subsidence. This linkage enables reservoir engineers to trace the deformation of rocks and the movement of produced hydrocarbons and/or injected fluids within the reservoir from seismic measurement attributes. This capability can be used to locate missed hydrocarbon reserves, improve recovery factors, enhance sweep efficiency, streamline operations, predict formation response, and calibrate reservoir simulators.

Two key requirements for interpreting time-lapse reservoir surveillance are reliable estimates of the state of stress & pore pressure and the petrophysical & geomechanical property distribution in the studied subterranean zone. This need for reliability can only currently be met by the use of subterranean compressional and shear interval velocity values, obtained from multicomponent seismic data, while accounting for the effects of lithology and fluid content. However, conventional techniques used for processing noisy multicomponent seismic data are inefficient and typically need an impracticably large storage and processing capacity. An additional important limitation of the state of the art is the inability to resolve small amplitude and hence poor signal-to-noise pulses from low impedance contrast boundaries and/or closely spaced or overlapping reflected seismic pulse arrivals from structural features which can be near the resolution limits of the frequency bandwidth of interrogation.

There is a need, therefore, for a method and/or a system for performing efficient seismic time-lapse characterization of subterranean formations. There is also a need to apply the aforementioned seismic time-lapse characterization to verify and/or calibrate one or more reservoir simulators.

SUMMARY

In one or more embodiments described herein, methods and systems for determining time strains for performing time-lapse characterization of a formation are provided. In at least one specific embodiment, the method can include providing a baseline seismic survey data set, providing a monitor seismic survey data set, decomposing the survey data into a four dimensional Clifford Algebra form, forming a matrix of columns of decomposed sensor measurement vectors, extracting time delays from the vectors, and determining time strains from the respective differences in the extracted time delays from the baseline survey and the monitor survey.

In one or more embodiments, the system can be adapted to calibrate a reservoir model by comparing the time strains generated from a reservoir model to the measured time strains of time-lapse seismic surveys of the reservoir. In at least one specific embodiment, the system can include constructing a static model of the reservoir, running a dynamic simulation of the static model, comparing the model time strains to the measured 4D time strains, and adjusting the static model parameters until the calculated time strains converge to the measured 4D time strains.

Embodiments of the disclosure may further provide an electronic method for seismic time-lapse characterization of an underground formation, wherein the method includes decomposing, with microprocessor executing a predefined set of instructions stored in a memory, baseline and monitor seismic survey data of a formation into a four dimensional Clifford Algebraic form; extracting, via the microprocessor, time delays from a matrix of decomposed sensor measurement vectors generated based on the four dimensional Clifford Algebra form; determining, via the processor, time strains for the underground formation from differences in the extracted time delays from the matrix; and displaying the determined time strains for the underground formation to a user via a monitor or a hard copy printed document.

Embodiments of the disclosure may further provide a computer program embodied on a computer readable medium, that when executed by a processor, is configured to control a method for seismic time-lapse characterization of an underground formation. The method may generally include retrieving a baseline seismic survey data set and a monitor seismic survey data set from a memory element; electronically decomposing the baseline seismic survey data set and the monitor seismic survey data set into a four dimensional Clifford Algebraic form that is used to form a matrix of columns of decomposed sensor measurement vectors; extracting time delays from the decomposed sensor measurement vectors; calculating time strains from respective differences in the extracted time delays; and displaying the calculated time strains to a user via a monitor or a print out.

Embodiments of the disclosure may further provide a method for seismic time-lapse characterization of an underground formation, wherein the method may include obtaining seismic survey data from a baseline survey and from a monitor survey; decomposing the survey data can be decomposed into a four dimensional Clifford Algebraic form; forming a matrix of columns of sensor measurement vectors; extracting time delays and calculating time strains from the baseline survey and the monitory survey; and displaying a seismic time-lapse characterization of the underground formation to a user, where the characterization is generated from the extracted time delays and calculated time strains.

Embodiments of the disclosure may further include a method for calibrating underground reservoir models. The method may include constructing a static model of the underground reservoir; running a dynamic simulation of the constructed static model; comparing a time strain from the static model to measured 4D time strains of the underground reservoir, adjusting parameters of the static model until calculated time strains for the static model converge to the measured 4D time strains of the underground reservoir.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
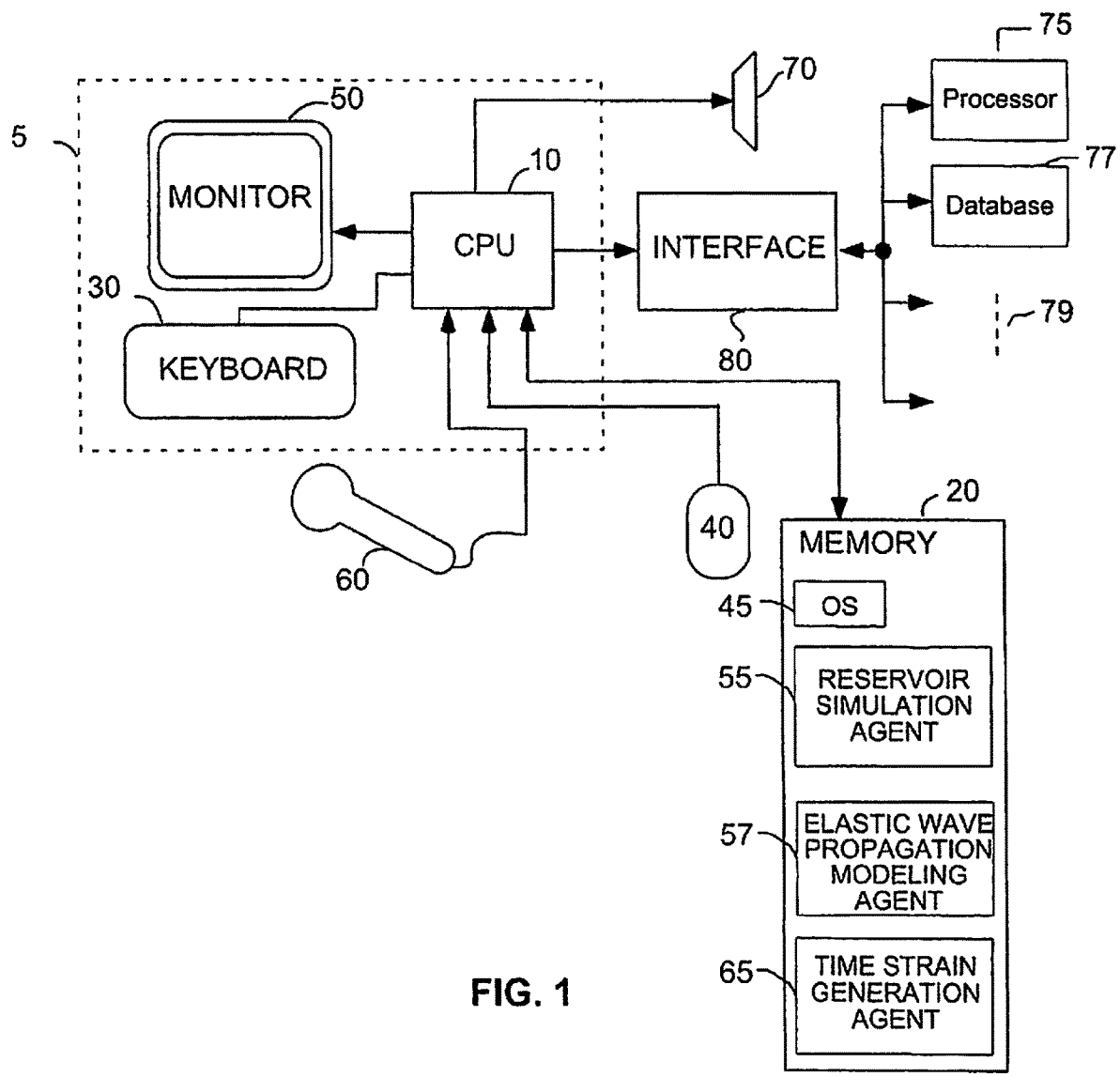
FIG. 1 depicts a representative system for performing seismic time-lapse characterization of subterranean formations and/or for verifying and/or calibrating one or more reservoir simulators according to one or more embodiments described.

It is to be understood that the following disclosure describes several exemplary embodiments for implementing different features, structures, or functions of the invention. Exemplary embodiments of components, arrangements, and configurations are described below to simplify the present disclosure; however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Further, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

FIG. 1 depicts a representative system for performing seismic time-lapse characterization of subterranean formations, which can also be used to verify and/or calibrate one or more reservoir simulators. A formation, although generally known in the art, is intended to mean the underground zone that includes the reservoir, the overburden, the underburden, and the side-burdens. A computer 5 can include a central processing unit 10, an input device or keyboard 30, and a display device or monitor 50. The computer 5 may be loaded with a software package according to one or more embodiments described herein that can be executed to perform or conduct the methods or processes of the present disclosure. The computer 5 can also include a memory 20 as well as additional input and output devices, for example a mouse 40, a microphone 60, and a speaker 70. The mouse 40, the microphone 60, and the speaker 70 can be used for, among other purposes, universal access and voice recognition or commanding. The monitor 50 can be touch-sensitive to operate as an input device as well as a display device.

The computer 5 is also configured to interface with database 77, support computer or processor 75, other databases and/or other processors 79, or the Internet or other designated electronic communications networks via the interface 80. It should be understood that the term "interface" does not indicate a limitation to interfaces that use only Ethernet connections and refers to all possible external interfaces, wired or wireless. It should also be understood that database 77 and/or processor 75 are not limited to interfacing with computer 5 using network interface 80 and can interface with computer 5 through any known device or system sufficient to create a communications path between the computer 5 and database 77 and/or processor 75. For example, in one or more embodiments, database 77 can interface with computer 5 via a USB interface while processor 75 can interface via another high-speed data bus without using the network interface 80. In another example, the computer 5, processor 75, and other processors 79 can be configured as part of a multiprocessor distributed system.

It should be understood that even though the computer 5 is shown as a platform on which the methods described can be performed, the methods described could be performed on any electronic platform. For example, the many and varied embodiments described herein can be used on any apparatus or device that has computing capability. For example, the computing capability can include the capability to access any communications bus protocols via the interface 80 such that the user can interact with the many and varied computers 5, processors 75, and/or other databases and processors 79 that can be distributed or otherwise assembled. These devices can include, but are not limited to and are presented for illustrative purposes only: supercomputers, arrayed server networks, arrayed memory networks, arrayed computer networks, distributed server networks, distributed memory networks, distributed computer networks, desktop personal computers (PCs), hand-held microprocessor devices, tablet PCs, hand held PCs, laptops, devices sold under the trademark names BLACKBERRY™ or PALM™, cellular phones, hand held music players, or any other device or system having computing capabilities.

Still referring to FIG. 1, programs can be stored in the memory 20 and the central processing unit 10 can work in concert with memory 20 to execute the instructions contained in the software, which may include the use of the input device 30 and the output device 50, to perform tasks for a user. In one or more embodiments, the memory 20 can include any number and combination of memory devices, without limitation, as is currently available or can become available in the art. In one or more embodiments, memory devices can include without limitation, and for illustrative purposes only: database 77, other databases or processors 79, hard drives, disk drives, random access memory, read only memory, electronically erasable programmable read only memory, flash memory, thumb drive memory, and any other memory device. Those skilled in the art are familiar with the many variations that can be employed using memory devices and no limitations should be imposed on the embodiments herein due to memory device configurations and algorithm prosecution techniques.

The memory 20 can store an operating system (OS) 45, a reservoir simulation agent 55, an elastic wave propagation modeling agent 57, and a time strain generation agent 60. Each of the "agents" described herein may be hardware or software based. Furthermore, each of the agents described herein may also be a module, wherein a module may be general-purpose, or may have dedicated function such as memory management, program flow, instruction processing, object storage, etc. The modules can be implemented in any way known in the art. For example, in one embodiment a module is implemented in a hardware circuit including custom VLSI circuits or gate arrays, off-the-shelf semiconductors such as logic chips, transistors, or other discrete components. One or more of the modules may also be implemented in programmable hardware devices such as field programmable gate arrays, programmable array logic, programmable logic devices or the like.

In an exemplary embodiment, one or more of the modules defined in the present disclosure may be implemented in software for execution by various types of processors. An identified module of executable code may, for instance, include one or more physical or logical blocks of computer instructions that may be organized as an object, procedure, or function. Further, the executables of an identified module need not be physically located together, but may include disparate instructions stored in different locations that, when joined logically together, include the module and achieve the stated purpose for the module. A "module" of executable code could be a single instruction, or many instructions, and may be distributed over several different code segments, among different programs, and across several memory devices. Similarly, operational data may be identified and illustrated in association with one or more modules, and may be embodied in any suitable form and organized within any suitable type of data structure. The operational data may be collected as a single data set, or may be distributed over different locations including over different storage devices, and may exist, at least partially, as electronic signals on a system or network.

In some embodiments, higher-level components may be used as modules. For example, one module may include an entire computer acting as a network node. Another module may include of an off-the-shelf or custom program, such as a database management system. These higher-level modules may be decomposable into smaller hardware or software modules corresponding to different parts of a software program and identifiable chips (such as memory chips, ASICs, or a CPU) within a computer.

Returning to the discussion of the present disclosure, the operating system 45 (shown in FIG. 1) facilitates control and execution of software using the CPU 10. Any available operating system can be used in this manner including WINDOWS™, LINUX™, Apple OS™, UNIX™, and the like. In accordance with one embodiment of the disclosure, the CPU 10 can execute the formation simulation agent 55 when the user requests, among other requests, to construct a simulation model of at least a portion of a formation.

For example, the formation simulation model can be constructed using a N-phasic finite element model. In one or more embodiments, the N-phasic model can be developed by constructing a coarse scaled rock model associated with a given formation from raw information sources. Raw information can come from geological, geophysical, geomechanical, and operations procedures that yield electromagnetic, gravitational, seismic, well log, core, drilling, and production data. The coarse scaled rock model can be used to construct one or more coarse scale and/or one or more fine scale geomechanics and petrophysics property models. From the one or more coarse scale and/or one or more fine scale geomechanics and petrophysics property models, one or more multi-grid, multiscale or multilevel finite element simulation models of at least a portion of the formation can be constructed by up-scaling the one or more fine scale property models.

In one or more embodiments, the CPU 10 can execute, either from a user request or automatically, the elastic wave propagation modeling agent 57 to generate wave propagation models of the simulation model constructed by the formation simulation agent 55. In one or more embodiments, the CPU 10 can execute, either from a user request or automatically, the time strain generation agent 60 to determine time strains for the formation. The time strains can be generated by comparing the wave propagation time delays within the formation measured by a baseline seismic survey to the delays measured by a monitor seismic survey. The time strains can be used for performing seismic time-lapse characterization of the formation. The CPU 10 can execute the time strain generation agent 60 to determine time strains for the simulation model constructed by the formation simulation agent 55 by comparing wave propagation time delays within the simulated formation as generated by the elastic wave propagation modeling agent 57. The time strain generation agent 60 can compare the measured time strain results to those generated from the results of the elastic wave propagation modeling agent 57 to verify and/or calibrate the formation simulation agent 55 modeled responses. In one or more embodiments, the formation simulation agent 55 can be executed to compare the measured time strain results from the time strain generation agent 60 to those generated by the time strain generation agent 60 from the results of the formation simulation agent 55 to verify and/or calibrate the formation simulation agent 55 response.

It should be noted that the formation simulation agent 55, the elastic wave propagation modeling agent 57, and the time strain generation agent 60 can be fully autonomous code sets, partially integrated code sets, or fully integrated code sets, and no limitations should be construed from the depiction of the formation simulation agent 55, the elastic wave propagation modeling agent 57, and the time strain generation agent 60 as separate agents. It should also be noted that it is not necessary to execute the formation simulation agent 55, the elastic wave propagation modeling agent 57, and the time strain generation agent 60 simultaneously nor is it necessary to execute the three agents on the same computer 5.

Figure 2:
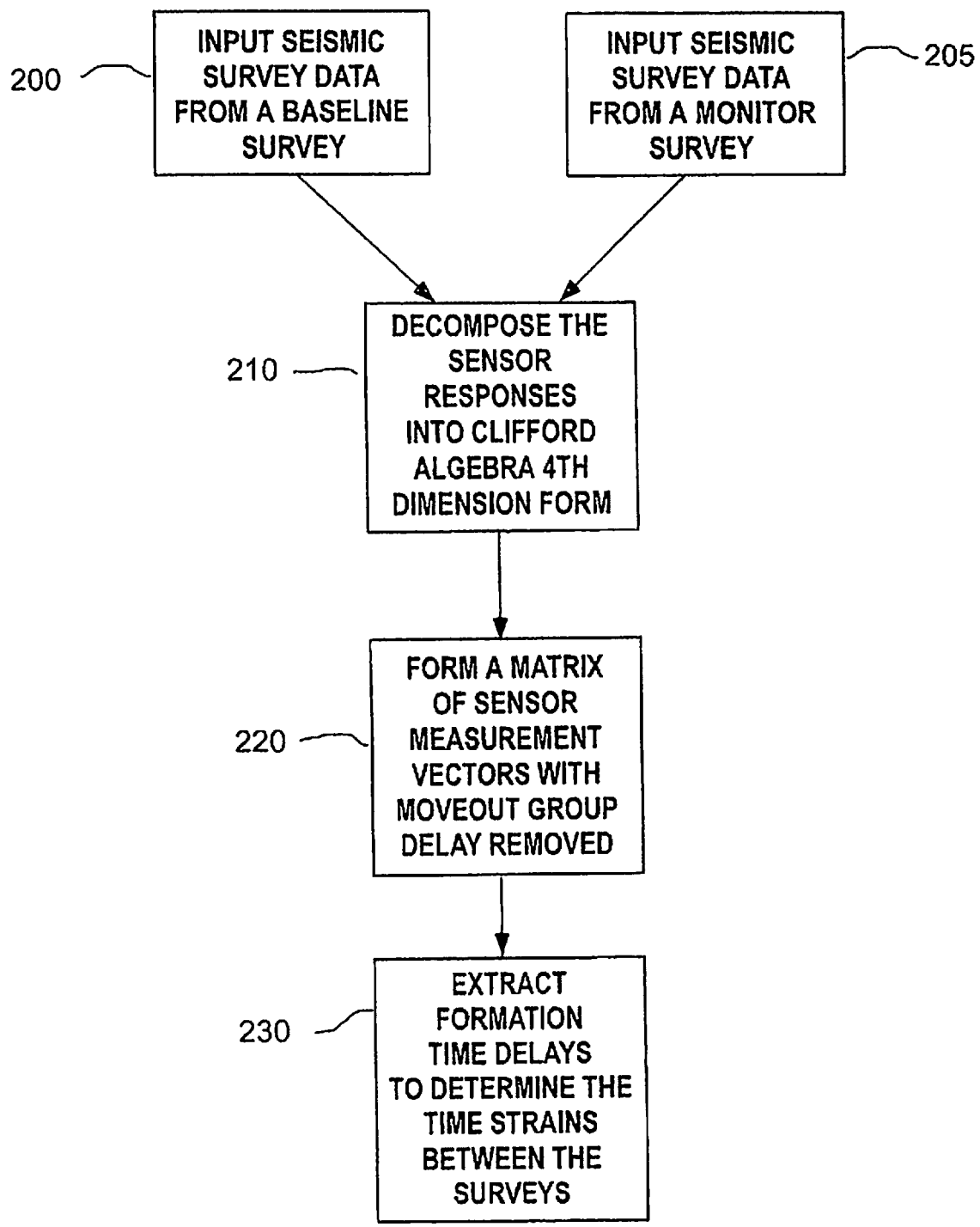
FIG. 2 depicts a representative process flow for determining time strains for performing seismic time-lapse characterization of a formation according to one or more embodiments.

FIG. 2 depicts a representative process flow for determining time strains for performing seismic time-lapse characterization of a formation according to one or more embodiments. In one or more embodiments, Seismic survey data from a baseline survey 200 and from a monitor survey 205 can be provided, the survey data can be decomposed into a four dimensional Clifford Algebra form 210, a matrix of columns of sensor measurement vectors can be formed 220, and time delays can be extracted and time strains determined 230 from the respective differences in the extracted time delays from the baseline survey 200 and the monitory survey 205.

In one or more embodiments, a seismic survey of a formation can be performed using known techniques to collect seismic survey data using sensor arrays or other known techniques. At any given time, a baseline survey can be taken of the formation. For example, in a hydrocarbon production operation, just prior to production operations beginning, a baseline seismic survey can be performed to determine the subterranean conditions of the formation within the survey area. At some time in the future, an additional monitor survey can be taken. For example, six months after production of the reservoir has begun, a monitor survey can be taken. The baseline data and the monitor data can be decomposed to determine the time strains between the baseline survey and the monitor survey. In one or more embodiments, a maximum likelihood estimation technique can be used to determine the time strains. It should be noted that monitor surveys can be taken at any time intervals, days, months, or years, after the baseline survey is taken. It should also be noted that the baseline survey does not have to be the first survey taken of a formation, it can be any survey in time.

In one or more embodiments, a four dimensional Clifford Algebra model can be used conceptually as the basis for decomposing the measured seismic survey data. For example, a time (t) dependent response of a single three component seismic sensor array can be expressed, in continuous wave form, by equation (1):

$$q^{(r)}(t) = \sum_{l=1}^{L} p_l^{(r)}(t) g_l(t - \theta_l) + n^{(r)}(t), \quad (1)$$

where, $q^{(r)}(t)$ is a Clifford Algebra 4th dimension element representing the r-th realization of the sensor or the moveout group delay removed r-th sensor response, $p_l^{(r)}(t)$ is the time varying scalar amplitude, $g_l(t-\theta_l)$ is the polarized component waveform delayed by time delay $\theta_l$, L is the total number of delays or layers expected in the formation, and $n^{(r)}(t)$ is the non-polarized Gaussian white noise. In one or more embodiments, the value for L can be based on the known or assumed number of layers in the given formation. The known or assumed number of layers can be derived from seismic surveys, formation core sampling, formation simulations, or by using other known techniques.

For a single realization, equation (1) can be expressed in discrete time domain by equation (2):

$$q = Pg + n \quad (2)$$

where measurement vector q can be an element of the Hamilton complex numbers matrix class $H^M$, ($q \in H^M$), Vandermonde matrix P can be an element of $H^{M \times L}$ ($P \in H^{M \times L}$), and delay vector signals g can be an element of $H^M$ ($g \in H^M$) where M denotes the number of samples recorded and n is the noise vector.

In one or more embodiments, the survey data can be decomposed into any Clifford Algebra model form. In one or more embodiments, the survey data can be decomposed into a four dimensional Clifford Algebra form 210 expressed by equation (3):

$$q(t) = a(t) + b(t)i + c(t)j + d(t)k \quad (3)$$

where, a(t),b(t),c(t),d(t) can denote the Clifford Algebra 4th dimension element components for any given time (t) where a(t) can represent the scalar pressure measurement; b(t),c(t),d(t) can represent the three polarization components, measured component displacement vibrations, or vector responses of the sensor; and i, j, and k can be the complex valued bases. In one or more embodiments, identifying and separating polarization components, as in equation (3), can lead to greater computational efficiency. For example, a reduction of from about 40% to about 60% in computer storage and processing requirements can be achieved by Clifford algebra (quaternion) formulation and solution of equation (2).

The three polarization components (one compressional and two shear components in isotropic media or one quasi longitudinal and two quasi shear components in anisotropic media) can be separated from a singular value decomposition of measurement data matrix $Q \in H^{M \times N}$ to separate the signal and noise space, where M is the length of a measurement vector of the digitized responses and N is the number of sensors or number of realizations, one or more methods of which are known in the art. For example, at least one method for separating signal and noise space from the three polarization components is described in the reference *Optimum Signal Processing: Estimation Theory*, Orfanidis, S., J., Macmillan, New York, 1988. In one or more embodiments, matrix Q can contain columns of N sensor measurement vectors q.

In one or more embodiment, variations of standard signal processing techniques, for example, MUSIC and ESPRIT, can be applied to detect and estimate time delays in the given formation. In one or more embodiments, a maximum likelihood technique can be applied to the measurement vectors arranged in a complex domain C in the form of equation (5) below rather than in the Hamilton domain H. The maximum likelihood technique can be used to detect and estimate time delays for closely spaced or overlapping seismic events. In one or more embodiments, the maximum likelihood technique can be applied to low-rank signals in additive noise conditions. Extension to the Hamilton domain can be achieved using techniques known in the art.

In one or more embodiments, the maximum likelihood technique can include initializing a coefficient vector C as a complex valued unit vector, forming a Toeplitz matrix from the m-th iteration of the coefficient matrix vector, forming a data matrix from shifted samples of n-th realizations of a time discretized sensor signal vector, solving a minimization problem to find convergence of the components of vector C, and finding S complex roots which can give the S time delays of tops and bases of the layers within the formation under study.

In one or more embodiments, a complex valued unit vector can be formed by initializing a coefficient matrix vector of length (S+1), $c^{(m=0)}$ for iteration m=0. The initialized coefficient matrix vector $c^{(m=0)}$ can be a first approximation of the converged components of matrix $C^{(m)}$ shown below. For example, the first component of vector c can be set to a value of 1+i and the remaining components can be set to zero.

The Toeplitz matrix, a matrix in which each descending diagonal from left to right is constant, can be formed as an M×(M−S) Toeplitz matrix $C^{(m)}$ from the m-th iteration of the coefficient matrix vector $c^{(m)}$ given by equation (4):

$$C^{(m)} = \begin{bmatrix} c_p^* & 0 & \ldots & 0 \\ c_{p-1}^* & 0 & \ldots & 0 \\ \cdot & \cdot & \ldots & \cdot \\ c_0^* & \cdot & \ldots & 0 \\ 0 & 0 & \ldots & c_p^* \\ 0 & 0 & \ldots & c_{p-1}^* \\ \cdot & \cdot & \ldots & \cdot \\ 0 & 0 & \ldots & c_0^* \end{bmatrix} \quad (4)$$

Where m is the total number of time samples (>S), superscript * denotes the complex conjugate of the component vector and the subscript notations denote the various components of the c vector, for example, $c_o$ is the first component of the vector, $c_p$ is the p-th component, and so on. The matrix $C^{(m)}$ can be described as the set of unknown complex roots that when solved can be used to derive the time delays from one or more seismic surveys of a given formation.

In one or more embodiments, the data matrix $Q_{(n)}$ of columns of sensor measurement vectors can be formed 220 from time shifted samples, from equation (3), of the n-th realization of the time discretized sensor signal vector $q_{(n)}$ and can be given by equation (5):

$$Q = \begin{bmatrix} q(N+1) & q(N) & \ldots & q(1) \\ q(N+2) & q(N+1) & \ldots & q(2) \\ \cdot & \cdot & \ldots & \cdot \\ \cdot & \cdot & \ldots & \cdot \\ \cdot & \cdot & \ldots & \cdot \\ q(M) & q(M-1) & \ldots & q(M-N) \end{bmatrix} \quad (5)$$

where M is the total number of time samples (>L) and N is the number of shots in a single sensor survey environment or the number of realizations in a multiple sensor survey environment.

In one or more embodiments, time delays can be extracted and time strains determined 230 by solving the minimization problem described by equations (6) through (9) below for both the baseline and monitor surveys and calculating the time strains. In one or more embodiments, the matrix $A_u^{(m)}$, given by equation (6) below, can be evaluated:

$$A_u^{(m)} = \sum_{n=1}^{N} Q_{(n)}^H (C^{(m)H} C^{(m)})^{-1} Q_{(n)} \quad (6)$$

where superscript H stands for conjugate transpose or Hermitian Transpose. In one or more embodiments, the unknown components of the $C^{(m)}$ matrix for a m-th iteration can be determined by minimizing equation (7):

$$\min_{c^{(m+1)}} \{c^{(m+1)H} A_u^{(m)} c^{(m+1)}\} \quad (7)$$

In one or more embodiments, checking for convergence can include evaluating equation (6) for the next iteration for m=m+1 and applying a convergence test, given by equation (8) in the normed sense for vector $c^{(m+1)}$:

$$\|c^{(m+1)} - c^{(m)}\| < \delta \quad (8)$$

where δ is a convergence limit. In one or more embodiments, convergence is achieved when the convergence test has been satisfied. In one or more embodiments, the convergence limit δ can be set at any value. For example, the convergence limit can be set at 0.01 or 0.001 or any value sufficiently low enough to indicate the calculated values of the c vectors have converged. In one or more embodiments, if the convergence limit δ is not met, the minimization problem described by equations (6) through (8) for the m-th plus 1 iteration can be solved. These calculations can be continued until convergence is achieved.

In one or more embodiments, if convergence has been achieved, equation (9) can be solved:

$$c^{(m)}(z) = 0 \quad (9)$$

where z is the frequency domain parameter or z transform parameter of the baseline and monitor surveys. Solving equation (9) can determine the s complex roots for the baseline and monitor surveys that can give the s time delays of tops and bases of layers within the surveyed formation.

In one or more embodiments, a time delay vector τ of length s, where s is an even number, can be constructed from the solutions from the baseline survey and/or the monitor survey from equation (9). The time strains, δτ/τ, for each layer can be determined from the difference between the time delays from the baseline survey and the monitor survey δτ. In one or more embodiments, the measured time strains, δτ/τ, from the measured survey data, can be used to verify and/or calibrate a reservoir model by calculating time strains for the model at a baseline condition and at a monitor condition state and comparing the ratios generated from the model to those measured from the baseline and monitor surveys.

Figure 3:
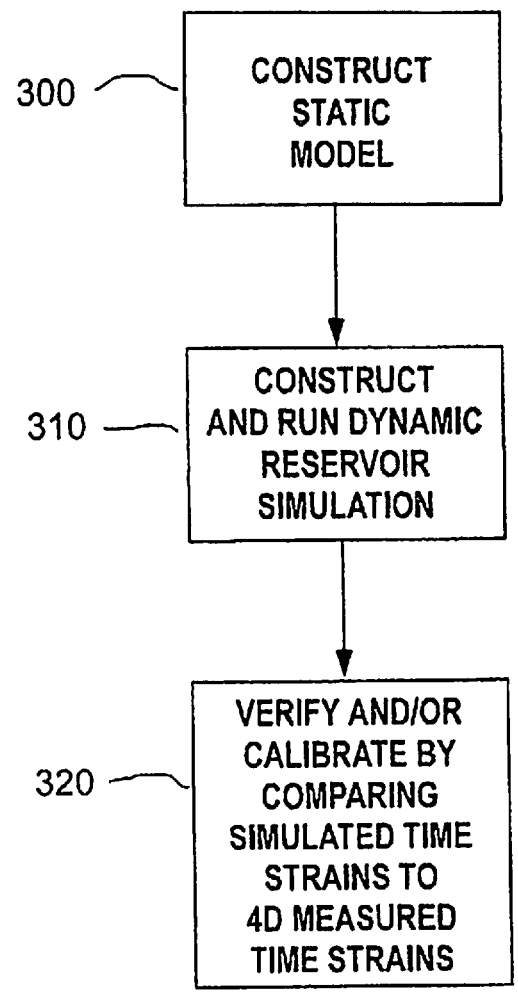
FIG. 3 depicts a representative process flow for verifying and/or calibrating a reservoir model by comparing the time strains generated from the model to the time strains of time-lapse seismic surveys of the actual reservoir according to one or more embodiments.

FIG. 3 depicts a representative process flow for verifying and/or calibrating a reservoir model by comparing the time strains generated from the model to the time strains of time-lapse seismic surveys of the actual reservoir according to one or more embodiments. In one or more embodiments, a static model can be constructed 300, a dynamic simulation of the static model can be run 310, and the dynamic simulation can be verified and/or calibrated by comparing the model time strains to measured 4D time strains 320 with reference to FIG. 2 above.

In one or more embodiments, constructing a static model 300 can be performed using known methods or by using one or more embodiments described below with reference to FIG. 4. For example, using known techniques, equations (12) through (34) can be used to construct a static model of at least a portion of a formation of interest.

Referring again to FIG. 3, constructing a static model 300 can include the pre-processing of data. For example, input data such as formation geometry, can be used to construct a finite element mesh, material properties can be used to construct a constitutive model, and initial conditions can be used as a starting point in estimating a potential reservoir's production conditions. Constructing a static model 300 can include constructing a regional geological macro-model (of the order of hundreds to thousands of meters) that may include several fields and reservoirs within.

The static model construction 300 can include generating a very coarse scale geological-petrophysical meso-model (of the order of tens to hundreds of meters) for the reservoir and immediate surrounding zone under consideration. The static model construction 300 can include a coarse scale reservoir meso-model (of the order of meters to hundreds of meters) that defines reservoir features such as faults and salt intrusions from structural, stratigraphic, facies, petrophysical and geomechanical information from available seismic, well log, core, drilling and production data. The static model construction 300 can include several fine scale micro-models (of the order of fractions of meters to meters) that can define features such as wells and enmesh within the meso-models. The static model construction 300 can include using one or more of the macro, meso, and micro-models to construct a static model consisting of, for example, reservoir units.

In the exemplary embodiments provided herein, constructing and running a dynamic formation simulation 310 can include dynamic simulations on multiple realizations of the static models obtained using, for example, co-kriging and/or co-simulation techniques; and time marching alteration of reservoir permeabilities and porosities based on geomechanical strains and statistical analyses of the results. Statistical analysis of the dynamic formation simulation 310 can yield probability distributions, such as Probability Density Functions ("PDF") or Cumulative Density Functions ("CDF"), of certain parameters such as production rates, gas-oil ratio (GOR), watercut rates and reservoir subsidence.

In an exemplary embodiment, optimization of the coupled flow and geomechanics (static) reservoir model can be performed by iterative history matching using reservoir production data and known iterative history matching methods. For example, assisted history matching, production data integration via inverse modeling as well as several other known methods for iterative history matching can be used. A detailed discussion of some known iterative history matching techniques can be found in chapter 10 of the reference *Streamline Simulation: Theory and Practice*, Datta-Gupta, A., and King, M. J., Landro, M., Society of Petroleum Engineers, Richardson, Tex., 2007. In one or more embodiments, the dynamic simulation can be based on the finite element formulation given by equation (42) with reference to FIG. 4 below.

Referring again to FIG. 3, in one or more embodiments, the dynamic simulation can be verified and/or calibrated by comparing the model time strains to measured 4D time strains 320 by obtaining measured values $$\left(\frac{\delta\tau}{\tau}\right)^o$$

over all seismic receiver array locations, with reference to FIG. 2 above, obtaining calculated time strain values $$\left(\frac{\delta\tau}{\tau}\right)^c$$

from the formation simulation, comparing the values, and adjusting the reservoir simulator until the calculated ratios converge to the measured ratios.

It should be noted that a useful quantitative relationship established by Landro and Stammeijer in the reference *Quantitative Estimation of Compaction and Velocity Changes Using 4-D Impedance and Traveltime Changes*, Landro, M., and Stammeijer, J., Geophysics, Vol. 69 No. 4, 949-957, 2004 can be described by equation (10):

$$\frac{\delta\tau}{\tau} = \frac{\delta y}{y} - \frac{\delta v}{v} \quad (10)$$

Equation (10) can be utilized to, among other things, estimate time strains from the results of reservoir simulator estimates of $$\frac{\delta y}{y} \text{ and } \frac{\delta v}{v}.$$

Here the vectors y and δy are the estimated reservoir bed thickness and bed thickness change respectively due to production and/or injection activities in the reservoir. The vectors v and δv are estimated seismic compressional velocity and velocity changes respectively due to production and/or injection activities in the reservoir. In one or more embodiments, $$\frac{\delta y}{y}$$

can be calculated from a reservoir model constructed using the reservoir simulator. For example, the reservoir model can be constructed using a multi-grid, multi-scale or multi-level fully coupled N-phasic finite element formulation, one or more embodiments of which are described below.

In one or more embodiments, $$\left(\frac{\delta\tau}{\tau}\right)^C, \frac{\delta y}{y}, \text{ and } \frac{\delta v}{v}$$

can be calculated using the elastic wave propagation modeling agent 57, with reference to FIG. 1 above, in the reservoir simulator when the simulator is modeling the formation in its baseline condition and in its monitor condition. The elastic wave propagation modeling agent 57 can include software for performing any of the known elastic wave propagation modeling techniques. For example, the techniques can include generating synthetic seismograms as discussed in the reference *Late Cretaceous volcanism in South and Central Texas—Stratigraphic, structural, and seismic models: GCAGS Transactions*, Thomas E. Ewing, and S. Christopher Caran, 1982, v. 32, p. 137-145; raytracing as discussed in the reference *Seismic Ray Theory*, Cerveny V. (2001), Cambridge University Press; one or more finite difference methods as discussed in the reference *Finite-difference methods for seismic wave propagation in heterogeneous materials*, Boore, D. (1972), Bolt, B. A. (ed), Methods in Computational Physics, Vol 11, Academic Press, New York; or one or more finite element methods as discussed in the reference *The application of finite-element analysis to body wave propagation problems*, Smith, W. D. (1975), Geophys. J. Roy. Astr. Soc., 42, 747-768, *Accuracy of finite-difference and finite-element modeling of the scalar and elastic wave equations*, Marfurt, K. J. (1984) Geophysics, 49, 533-549.

Referring again to FIG. 3, in one or more embodiments, a weighted least squares type quadratic objective function can be described by equation (11):

$$J(x) = \sum_{i=1}^{N_S} V_i^H W_i^V V_i + \sum_{k=1}^{N_P} P_k^H W_k^P P_k \quad (11)$$

$$V_i = \left[\left(\frac{\delta\tau}{\tau}\right)_i^C - \left(\frac{\delta\tau}{\tau}\right)_i^O\right]$$

and minimized, by known methods, for example the methods discussed in chapter 10 of the reference *Streamline Simulation: Theory and Practice*, Datta-Gupta, A., and King, M. J., Landro, M., Society of Petroleum Engineers, Richardson, Tex., 2007, to obtain the optimum vector of petrophysical/geomechanical parameters denoted by vector x. In one or more embodiments, function J(x) in equation (11) can be the objective function and the first term on the right hand side can denote the seismic data contribution and the second term on the right hand side can denote the production data contribution. In one or more embodiments, $W_k^P$ can represent the weighting matrices for the seismic and production data respectively; $N_S$, $N_P$ can represent the number of seismic and production data considered respectively; and $V_i$, $P_k$ can represent the difference between the model results and the measured results for the seismic and production data respectively. For example, $V_i$ can be the difference between the computed and observed time strains $$\frac{\delta\tau}{\tau}.$$

In one or more embodiments, the dynamic simulation model 310 can be corrected and equation (11) can be iterated until the time strains $$\left(\frac{\delta\tau}{\tau}\right)^O$$

obtained from actual 4-D measurement observations over N receiver array stations, with reference to FIG. 2 above, can be matched closely within a prescribed tolerance to the calculated reservoir simulator time strains $$\left(\frac{\delta\tau}{\tau}\right)^C$$

over the same array locations.

Figure 4:
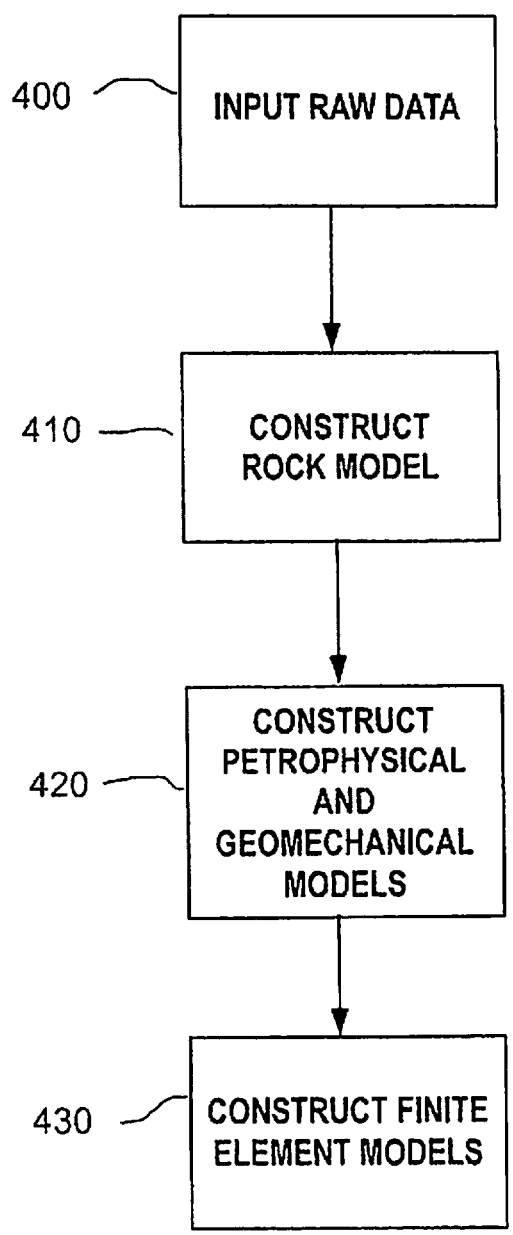
FIG. 4 depicts a representative process flow for developing a finite element model for use in a static model and a dynamic model simulation according to one or more embodiments.

FIG. 4 depicts a representative process flow for developing a finite element model for use in a static model and a dynamic model simulation according to one or more embodiments. In one or more embodiments, raw data 400 can be collected on a formation of interest. Raw data collection can involve, for example, geological, geophysical, geomechanical and operations procedures that can yield electromagnetic, gravitational, seismic, well log, core, drilling and production data. Raw data 400 can be used to construct a coarse scaled rock model 410 by processing the raw data 400 using one or more embodiments herein described. The rock model 410 can be used to construct one or more coarse and/or one or more fine scale petrophysical and geomechanical property models 420.

From the property models 420, one or more multi-grid, multiscale (or multilevel) finite element simulation models or finite element models 430 can be constructed. The finite element models 430 can depict at least a portion of the formation of interest. For example, at least two finite element models 430 can be created by up-scaling the fine scale property models 420 using multi-scale formulations. Also, it is noted here that multiple realizations for the reservoir can be constructed using co-kriging and co-simulation techniques as detailed in the reference *Geostatistical Reservoir Modeling*, Deutsch, C. V., Oxford University Press, 2002.

In one or more embodiments, several known equations and/or uniquely derived equations can be used in the steps described above for performing fully coupled analysis of multi-phase compositional fluid flow and/or heat flow in nonlinearly deforming porous solid formations with time-dependent failure. This analysis can be used to describe the fluid flow rates and/or heat flow rates over time through the formation of interest as part of developing a dynamic simulation of the formation of interest. The analysis can be used to model the nonlinearly deforming porous solid formations as fluid flows through the formation over any time period ranging from seconds to years to decades. In one or more embodiments, an equilibrium function can be described by equation (12):

$$\nabla \cdot (\sigma(r) - p(r)I) + f(r) = 0 \quad (12)$$

where, σ is the stress vector of the N-phasic medium (i.e. N=2, single phase fluid flowing in rock; N=3, two phase fluid flowing in rock; N=4, three phase fluid flowing in rock), I is the unit matrix, f is the body force, p is the average pressure, and r is a given location in the formation.

The average pressure p can be described by equation (13):

$$p(r) = \sum_{i=1}^{3} S_i(r) p_i(r) \tag{13}$$

where, $S_i, p_i$ denote the phase saturation and pressure respectively for the three phases at any given location r. The total strain is the sum of the linear elastic and nonlinear plastic or viscoplastic strains and can be determined from the elastic and viscoplastic constitutive relationships, the equations of which can be described by equations (14) and (15):
Elastic Constitutive Equation=>

$$\sigma = C\varepsilon_L; \varepsilon_L = \frac{1}{2}[\nabla u + (\nabla u)^T] \tag{14}$$

where $\varepsilon_L$ is the elastic strain vector, C is the elastic tensor which can be anisotropic in general and $\sigma$ is the stress.
Viscoplastic Flow Rule Equation=>

$$\partial_t \varepsilon_{NL} = \Gamma \frac{\partial N(\sigma')}{\partial \sigma'}; \Gamma = \frac{1}{x}\{M(\sigma')\} \tag{15}$$

where $\varepsilon_{NL}$ is the viscoplastic strain, $\Gamma$ is the material nonlinearity parameter, x is the relaxation time, $\sigma'$ is the effective stress tensor, $M(\sigma')$ is the yield function and $N(\sigma')$ is the flow potential.

The yield function $M(\sigma')$ can be described by equation (16):

$$M = \left\{ J_2\left[1 + C_1 J_3\left(\frac{1}{J_2}\right)^{1.5}\right]^n + C_2 I_1^2 + C_3 I_1^4 \right\}^{0.5} + C_4 I_1 + C_5 I_1^2 - C_6 \tag{16}$$

The flow potential function $N(\sigma')$ can be described by equation (17):

$$N = (C_7 J_2 + C_2 I_1^2 + C_3 I_1^4)^{0.5} + C_8 I_1 + C_5 I_1^2 \tag{17}$$

where $C_1$, $C_2$, $C_3$, $C_4$, $C_5$, $C_6$, $C_7$, $C_8$ and n are typically in the range of from about 1.0 to about 2.0, from about 0.003 to about 0.007, from about $1 \times 10^{-8}$ m$^2$/kN to about $2 \times 10^{-8}$ m$^2$/kN, from about 0.1 to about 0.3, from about $3 \times 10^{-6}$ m$^2$/kN to about $7 \times 10^{-6}$ m$^2$/kN, from about 5 to about 50 kN/m$^2$, from about 0.5 to about 1.5, from about 0.05 to about 0.3, and from about 0.4 to about 0.7 respectively for specific rock types within different regions of the world.

The parameters $I_1$, $J_2$, $J_3$ are respectively the standard first stress invariant and the second and third principal deviatoric stress invariants calculated from the effective stress tensor. The phase conservation and component conservation for the formation of interest can be described by equations (18) and (19):
Phase Conservation (Water: i=1, Oil: i=2, Gas: i=3)=>

$$\partial_t\left(\sum_{i=1}^{3} \phi S_i \rho_i\right) + \nabla \cdot \left(\sum_{i=1}^{3} \rho_i u^i\right) = \sum_{i=1}^{3} q_i^P \delta(r - r_0^P) + \sum_{i=1}^{3} q_i^R \delta(r - r_0^R) \tag{18}$$

Component Conservation (CH$_4$: j=1, C$_2$H$_6$: j=2, Etc)=>

$$\partial_t\left(\sum_{i=1}^{3} \phi S_i \rho_i C_{ij}\right) + \nabla \cdot \left(\sum_{i=1}^{3} \rho_i C_{ij} u^i\right) = \tag{19}$$

$$\nabla \cdot \left(\sum_{i=1}^{3} \phi S_i \rho_i D_{ij} \nabla C_{ij}(r)\right) + \sum_{i=1}^{3} q_i^P \alpha_{ij} \delta(r - r_0^P) + \sum_{i=1}^{3} q_i^R \beta_{ij} \delta(r - r_0^R)$$

where in equations (18) and (19) $\phi$ is the porosity, $\rho_i$ is the phase density; $C_{ij}$ is the mass fraction of component j in phase i; $u^i$ is the velocity vector of phase i; $D_{ij}$ is the macroscopic molecular diffusion tensor; $\alpha_{ij}$, $\beta_{ij}$ are the mass fractions of component j in phase produced and injected respectively; $q_i^P, q_i^R$ are the production and injection mass flow rates of phase i; and, $r_0^P, r_0^R$ are the location vectors of the production and injection locations.

The momentum conservation for the formation of interest can be described by equation (20):

$$q^i = -K(r, \varepsilon) \frac{k(r)_{ri}}{\mu(r)_i}(\nabla p_i(r) - \rho_i(r) g \nabla Z(r)) \tag{20}$$

where in equation (20), $q^i$ is the mass flow rate vector of phase i, K is the permeability tensor which can be anisotropic in general, $k_{ri}$ is the relative permeability of phase i, $\mu_i$ is the viscosity of phase i, g is the gravitational acceleration and Z is a potential metric. It should be noted here that the permeability K and the porosity $\phi$ values can be dependent on the total strain $\varepsilon$ (or reservoir deformation gradient) values from the previous time step.

The energy conservation for the formation of interest can be described by equation (21):

$$\partial_t\left[(1-\phi)\rho_r h_r + \sum_{i=1}^{3} \phi S_i \rho_i h_i\right] + \nabla \cdot \left(\sum_{i=1}^{3} \rho_i h_i u^i\right) = \tag{21}$$

$$\nabla \cdot (k_e \nabla T(r)) + \partial_t Q$$

where in equation (21), $\rho_r$ is the rock density, $h_r$ is the specific enthalpy of rock, $h_i$ is the specific enthalpy of fluid phase i, $k_e$ is the effective thermal conductivity of the rock/fluid mass, $T(r)$ is the temperature field and $\partial_t Q$ is the heat source flow rate. The total saturation constraint for each phase, Total mass fraction constraints for components in each phase, Liquid phase PVT equations for phase density and viscosity, Relative permeability, Phase Equilibria and Capillary Pressure for the formation of interest can be described by equations (22) through (29):
Total Saturation Constraint for Each Phase=>

$$\sum_{i=1}^{3} S_i = 1 \tag{22}$$

Total Mass Fraction Constraints for Components in Each Phase=>

$$\sum_{j=1}^{N} C_{1j} = 1 \tag{23a}$$

$$\sum_{j=1}^{N} C_{2j} = 1 \qquad (23b)$$

$$\sum_{j=1}^{N} C_{3j} = 1 \qquad (23c)$$

Liquid Phase PVT Equations for Phase Density and Viscosity are Derived from Experiments=>

$$\rho_i = \rho(p_i, C_{ij}(j=1 \ldots N)) \qquad (24)$$

$$\mu_i = \mu(p_i, C_{ij}(j=1 \ldots N)) \qquad (25)$$

Relative Permeability Equations=>

$$k_{ri} = k_{ri}(S_1, S_2, S_3) \qquad (26)$$

where in equation (26) the functions, $k_{ri}(S_1,S_2,S_3)$ are given as:

$$k_{rw} = (S'_w)^\beta [1 - (S''_w)^\delta]^\gamma \qquad (27)$$

$$k_{ro} = (S'_o)^\beta [1 - (S''_o)^\delta]^\gamma \qquad (28)$$

$$k_{rg} = (1 - S'_w - S'_o)^\lambda [(S''_w + S''_o)]^\mu \qquad (29)$$

where $$S'_w = \frac{S_w - S^r_w}{1 - S^r_w - S^r_o}, \text{ and, } S'_o = \frac{S_o - S^r_o}{1 - S^r_o - S^r_g} \qquad (30)$$

$$S''_i = 1 - (S'_i)^{\frac{1}{\gamma}}, \text{ for } i = 1, 2, 3; \text{ water, oil, gas} \qquad (31)$$

where in equation (30) superscripts "r" denote residual saturations. Typical values for exponents, $\beta$, $\delta$, $\gamma$, $\lambda$, $\mu$, can be in the range of from about 0.2 to about 0.7, from about 1 to about 2, from about 1 to about 3, from about 0.1 to about 0.5, and from about 1 to about 5 respectively.

Phase Equilibria Equations=>

$$\frac{C_{1j}(T(r), p(r))}{C_{2j}(T(r), p(r))} = K_{j12} \qquad (32a)$$

$$\frac{C_{2j}(T(r), p(r))}{C_{3j}(T(r), p(r))} = K_{j23} \qquad (32b)$$

$$\frac{C_{1j}(T(r), p(r))}{C_{3j}(T(r), p(r))} = K_{j13} \qquad (32c)$$

Capillary Pressure Equations=>

$$P_{c-ow} p_o - p_w = P_{cow}(S_1, S_2, S_3) \qquad (33)$$

$$P_{c-go} = p_g - p_o = P_{cgo}(S_1, S_2, S_3) \qquad (34)$$

where in equations (33) and (34) the functions $P_{cow}(S_1,S_2,S_3)$, $P_{cgo}(S_1,S_2,S_3)$ are standard empirical functions that can be derived from laboratory data for drainage and imbibition conditions.

The equations of a coupled multiphase flow and rock deformation can be given by equations (12) through (34). The equations (12) through (34) can be formulated into one or more finite element models in terms of a combination of the unknown response fields, for example, rock phase displacements, fluid phase velocities, fluid phase pressures and reservoir temperature.

The one or more finite element models can be used to solve for the response of the formation of interest to fluid flow through the formation. For example, during recovery of hydrocarbons from a formation of interest, water can be injected to push the hydrocarbons towards a well. While the fluid flows through the formations that make up the reservoir that contains the hydrocarbons, the formation pressures can change and the surrounding rocks can move. Using the one or more embodiments described herein the response of the formation of interest to the fluid flow associated with the hydrocarbon production can be estimated.

In one or more embodiments, the governing equations of the coupled multiphase flow and rock deformation can be given by equations (12) to (34). There can be (21+3p) unknowns where p is the number of components (methane, ethane etc) in each phase. The unknowns can include three components of rock displacement vector u, nonlinear strain $\varepsilon_{NL}$, nonlinear material parameter $\Gamma$, temperature T, three pressures $p_i$ (related to fluid velocities $v^i$ obtained from flow rates $q^i$ in equation (20), three saturations $S_i$, three densities $\rho_i$, three viscosities $\mu_i$, three permeabilities $k_{ri}$ and 3p component concentrations.

For example, there can be (21+3p) total equations to solve including three from equation (12), two from equation (15), p from equation (19), one each from equations (21) and (22) respectively, three each from equations (23), (24), (25), and (26) respectively, 2p from equation (32), and one each from equations (33) and (34).

A transient problem can be formulated from equations (12) to (34) and suitable boundary and initial conditions can also be prescribed as follows.

$$p(t) = p_0 \text{ on } \partial\Omega_p \qquad (35)$$

$$q(t) = q_0 \text{ on } \partial\Omega_f \qquad (36)$$

$$u(t) = u_D \text{ on } \partial\Omega_o \qquad (37)$$

$$\sigma \cdot n = t_N \text{ on } \partial\Omega_t \qquad (38)$$

$$u(0) = u_0 \qquad (39)$$

$$p(0) = p_0 \qquad (40)$$

In equations (35) through (40), $\partial\Omega_p$, $\partial\Omega_f$, $\partial\Omega_o$, $\partial\Omega_t$ can represent the surface boundary having pressure, fluid flux, displacement and traction specified respectively, and $u_0$, $p_0$ can be initial values of displacement and pressure. In one or more embodiments, a time-dependent transient coupled finite element model can be formulated as outlined in *The Finite Element Method Its Basis & Fundamentals*, Zienkiewicz, O. C., Taylor, R. L., 6th Edition, Elsevier Butterworth-Heinemann, Oxford, section 18.3.3, pp. 648-649, 2005 and *The Finite Element Method for Solid and Structural Mechanics*, Zienkiewicz, O. C., and Taylor, R. L., 6th Edition, Elsevier Butterworth-Heinemann, Oxford, section 2.4, pp. 24-28 and chapter 3, pp. 46-61, 2005.

For a single component three phase flow within a linear rock, the problem can be formulated in terms of a combination of the unknown response fields, namely, rock phase displacements, u, fluid phase pressures p, and reservoir temperature T and reduced to a form similar to equation (18.75) found in the reference *The Finite Element Method Its Basis & Fundamentals*, Zienkiewicz, O. C., Taylor, R. L., 6th Edition, Elsevier Butterworth-Heinemann, Oxford, 2005, p. 648, having similar matrix terms:

$$\begin{bmatrix} C & L_F & L_T \\ C_F & S_F & S_T \\ C_T & T_F & T_S \end{bmatrix} \frac{\partial}{\partial t} \begin{Bmatrix} u \\ p \\ T \end{Bmatrix} + \begin{bmatrix} K & Q_F & Q_T \\ O & H_P & O \\ O & O & H_T \end{bmatrix} \begin{Bmatrix} u \\ p \\ T \end{Bmatrix} = \begin{Bmatrix} f_1 \\ f_2 \\ f_3 \end{Bmatrix} \quad (41)$$

Those skilled in the art can deduce these matrices from terms found in the reference *The Finite Element Method Its Basis & Fundamentals*, Zienkiewicz, O. C., Taylor, R. L., 6$^{th}$ Edition, Elsevier Butterworth-Heinemann, Oxford, 2005, p. 648 and the equations given in *A finite element porothermoelastic model for dual-porosity media*, Nair, R. et al, *International Journal for Numerical and Analytical Methods in Geomechanics*, 28, pp. 875-898, 2004.

For a single component three phase flow within a nonlinear rock, a finite element formulation can be constructed of the form:

$$\begin{bmatrix} C_{NL} & O \\ O & R_{NL} \end{bmatrix} \frac{\partial}{\partial t} \begin{Bmatrix} x \\ y \end{Bmatrix} + \begin{Bmatrix} K_{NL}(x,y) \\ Z_{NL}(x,y) \end{Bmatrix} = \begin{Bmatrix} F_1 \\ F_2 \end{Bmatrix} \quad (42)$$

In equation (31), $C_{NL}$, $R_{NL}$, $K_{NL}$, $Z_{NL}$, $F_i$ are finite element model matrices and vectors. $C_{NL}$, $K_{NL}$ and $F_1$ can be derived from applying the Gauss integral theorem to the variational statements of equations (12), (18), and (21) with the use of equation (20) and interpolating the field variables by shape functions and nodal unknowns. In one or more embodiments, methods described in *The Finite Element Method for Solid and Structural Mechanics*, Zienkiewicz, O. C., and Taylor, R. L., 6$^{th}$ Edition, Elsevier Butterworth-Heinemann, Oxford, 2005 can be used. $R_{NL}$, $Z_{NL}$ and $F_2$ can be derived from equations (15), (16) and (17) for example, by using methods found in *The Finite Element Method for Solid and Structural Mechanics*, Zienkiewicz, O. C., and Taylor, R. L., 6$^{th}$ Edition, Elsevier Butterworth-Heinemann, Oxford, pp. 102-104, 2005. The vectors x,y can be unknowns of the model described by equation 31. Here, x can be a vector of unknown rock displacements u, fluid pressures p, and reservoir temperatures T. y can be a vector of unknown reservoir nonlinear (viscoplastic) strain $\varepsilon_{NL}$ and nonlinear material parameter $\Gamma$.

An extension of equation (42) to multi-component cases is only a matter of book-keeping and can be completed by those skilled in the art.

The matrix equations can be solved by standard methods on single processor and/or multiprocessor systems. In one or more embodiments, performing fully coupled analysis of multi-phase compositional fluid flow and/or heat flow in nonlinearly deforming porous solid formations with time-dependent failure can be achieved using equations (12) through (34) and one or more embodiments of the computer system 5 described in FIG. 1 above.

Prophetic Example

The foregoing discussion can be further described with reference to the following non-limiting, prophetic example. For simplicity and ease of description, only some of the calculations performed using the method and system are presented here.

Figure 5:
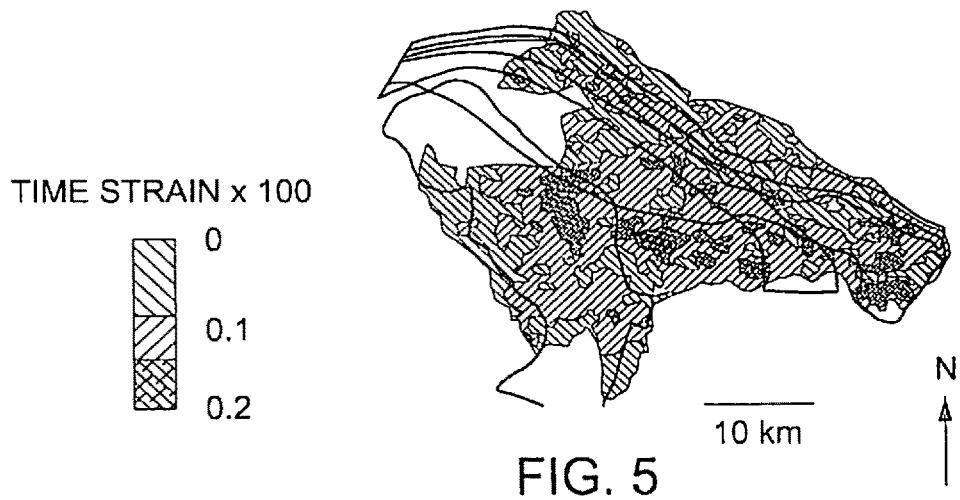
FIG. 5 depicts a contour of the modeled time strains after history matching to production data for the example reservoir.

In this prophetic example, a reservoir in the North Sea is studied. A static model with petrophysical and geomechanical properties was built using all available data. A series of dynamic geomechanical/flow coupled simulations were carried out with history matching to come up with an optimized reservoir petrophysical/geomechanical model as suggested above with reference to FIG. 3. A numerical seismic simulation was carried out on the final optimized simulation model output to derive time strains. FIG. 5 depicts a contour of the modeled time strains after history matching to production data for the example reservoir.

Figure 6:
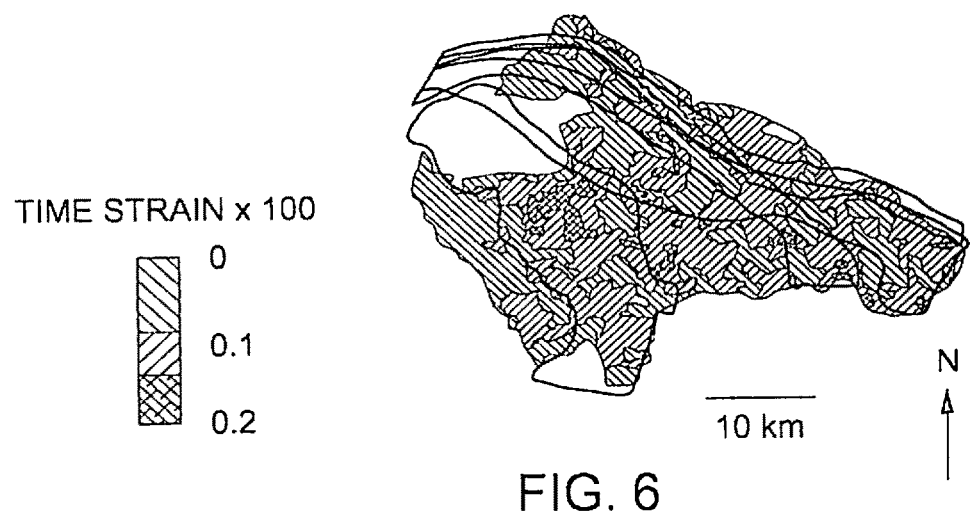
FIG. 6 depicts a contour of the reservoir model time strains for the example reservoir after history matching and time-lapse seismic data matching.

A baseline and monitor seismic survey were taken of the North Sea reservoir in this example. A similar matching procedure was carried out for the observed time strains from the 4D seismic measurements. The respective time strains from the geomechanics simulator and the 4D seismic measurements were compared to develop an optimized reservoir petrophysical/geomechanical model as suggested above with reference to FIG. 3. FIG. 6 depicts a contour of the reservoir model time strains for the example reservoir after history matching and time-lapse seismic data matching.

Figure 7:
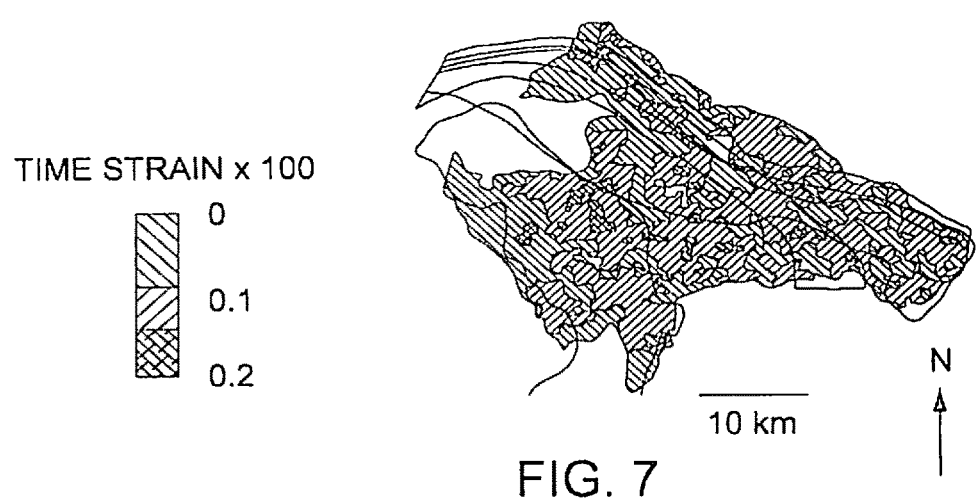
FIG. 7 depicts a contour of the actual observed time strains for the example reservoir.

FIG. 7 depicts a contour of the actual observed time strains for the example reservoir. Closer agreement is observed between FIGS. 6 and 7 than between FIGS. 5 and 6. This qualitative observation is confirmed by a smaller error norm calculated numerically between digital values of FIGS. 6 and 7.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application and for all jurisdictions in which such incorporation is permitted.

While the foregoing is directed to embodiments of the present disclosure, other and further embodiments of the disclosure may be devised without departing from the basic scope thereof. Additionally, the foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for using seismic time-lapse to characterize an underground formation, the method comprising:
   measuring, with the one or more processors, baseline and monitor seismic surveys of the underground formation;
   constructing, with the one or more processors, a set of multiple realizations of a static model of the underground formation;
   simulating, with the one or more processors, the constructed set of multiple realizations to show time delays in the underground formation where the simulating includes generating one or more wave propagation models;
   decomposing, with the one or more processors, the measured baseline and monitor seismic survey data into a multi-dimensional form;
   extracting, with the one or more processors, time delays from a matrix of sensor measurement vectors generated based on the multi-dimensional form;

determining, with the one or more processors, extracted time strains based on the time delays extracted from the matrix of sensor measurement vectors;

determining, with the one or more processors, simulated time strains by comparing wave propagation time delays associated with the wave propagation models generated during simulating; and selecting the realization of the static model that minimizes the differences between the extracted time strains and the simulated time strains.

2. The method of claim 1, where determining the extracted time strains comprises comparing wave propagation time delays within the underground formation measured by the baseline seismic survey to wave propagation time delays measured by the monitor seismic survey.

3. The method of claim 1, further comprising:
comparing simulated wave propagation time delays to measured wave propagation time delays to verify data or calibrate formation simulation equipment.

4. The method of claim 1, further comprising:
conducting a seismic survey of the underground formation and surrounding area to collect data for the baseline and monitor seismic surveys.

5. A non-transitory computer readable medium storing instructions that, when executed by one or more processors, causes the one or more processors to perform operations comprising:
measuring a baseline seismic survey data set and a monitor seismic survey data set;
constructing a set of multiple realizations of a static model of the underground formation;
simulating the constructed set of multiple realizations to reflect time delays in the underground formation where the simulating includes generating wave propagation models;
electronically decomposing the measured baseline seismic survey data set and the measured monitor seismic survey data set into a multi-dimensional form;
extracting time delays from a matrix of sensor measurement vectors based on the multi-dimensional form;
calculating extracted time strains based on the time delays extracted from the matrix of sensor measurement vectors; and
calculating simulated time strains by comparing wave propagation time delays associated with the wave propagation models generated during the simulating.

6. The non-transitory computer readable medium of claim 5, where calculating the extracted time strains comprises comparing wave propagation time delays within the underground formation measured by the baseline seismic survey data set to wave propagation time delays measured by the monitor seismic survey data set.

7. The non-transitory computer readable medium of claim 6, where the operations further comprise:
comparing simulated wave propagation time delays to measured wave propagation time delays to verify data or calibrate formation simulation equipment.

8. The non-transitory computer readable medium of claim 7, where the operations further comprise conducting a seismic survey of the underground formation and surrounding area to collect the baseline and monitor seismic survey data sets.

9. A method for characterizing an underground formation using seismic time-lapse, the method comprising:
obtaining seismic survey data from a baseline seismic survey and from a monitor seismic survey;
decomposing the survey data into a multi-dimensional Clifford Algebraic form;
extracting measured time delays from a matrix of the decomposed seismic survey data generated based on the multi-dimensional Clifford Algebraic form;
determining measured time strains from differences in the measured time delays;
constructing a set of multiple realizations of a static model of the underground formation;
simulating the constructed set of multiple realizations to reflect time delays in the underground formation where the simulating includes generating wave propagation models; and
determining simulated time strains based on the simulating by comparing wave propagation time delays associated with the wave propagation models generated during the simulating.

10. The method of claim 9 further comprising comparing simulated wave propagation time delays to measured wave propagation time delays to verify data or calibrate formation simulation equipment.

11. The method of claim 9 where determining the simulated time strains further comprises comparing wave propagation time delays with measured wave propagation time delays to verify or calibrate formation simulation module modeled responses.

12. The method of claim 9 further comprising conducting a seismic survey of the underground formation and surrounding area to collect the baseline and monitor seismic survey data.

13. An apparatus for characterizing an underground formation using seismic time-lapse, the apparatus comprising:
a memory; and
one or more processors connected to the memory, the one or more processors configured to:
obtain seismic survey data from a baseline seismic survey and from a monitor seismic survey;
decompose the seismic survey data into a multi-dimensional form;
extract measured time delays from a matrix of the decomposed seismic survey data generated based on the multi-dimensional form;
determine measured time strains from differences in the measured time delays;
construct a set of multiple realizations of a static model of the underground formation;
simulate the constructed set of multiple realizations to reflect time delays in the underground formation where the simulating includes generating wave propagation models; and
determine simulated time strains based on the simulating by comparing wave propagation time delays associated with the wave propagation models generated during the simulating.

* * * * *